United States Patent [19]

Casciotti et al.

[11] Patent Number: 5,092,781

[45] Date of Patent: Mar. 3, 1992

[54] ELECTRICAL CONNECTOR USING SHAPE MEMORY ALLOY COIL SPRINGS

[75] Inventors: Albert Casciotti, Hershey, Pa.; Frederick R. Deak, Kernersville; David B. Wrisley, Jr., Greensboro, both of N.C.

[73] Assignee: AMP Incorporated, Harrisburg, Pa.

[21] Appl. No.: 610,619

[22] Filed: Nov. 8, 1990

[51] Int. Cl.⁵ .................................................. H01R 9/09
[52] U.S. Cl. .................................... 439/62; 439/161; 439/196
[58] Field of Search ...................... 439/62, 64, 65, 67, 439/74, 77, 161, 179, 196, 211, 260, 377, 493, 630, 636, 637

[56] References Cited

U.S. PATENT DOCUMENTS

| | | | |
|---|---|---|---|
| 4,743,079 | 5/1988 | Bloch | 439/161 |
| 4,781,605 | 11/1988 | Herubel et al. | 439/161 |
| 4,881,908 | 11/1989 | Perry et al. | 439/161 |
| 4,969,824 | 11/1990 | Casciotti | 439/62 |

Primary Examiner—Paula A. Bradley
Attorney, Agent, or Firm—Allan B. Osborne

[57] ABSTRACT

An electrical connector (39) provides high density interconnections through contact paths of printed circuit pads (12, 31) via flexible circuit (22) having contact pads (26, 28) driven by a canted coil spring (40) formed of a shape memory alloy selectively responsive to variations in temperature applied to the coil through a medium, heated or cooled and supplied via passage (62) in the connector.

8 Claims, 4 Drawing Sheets

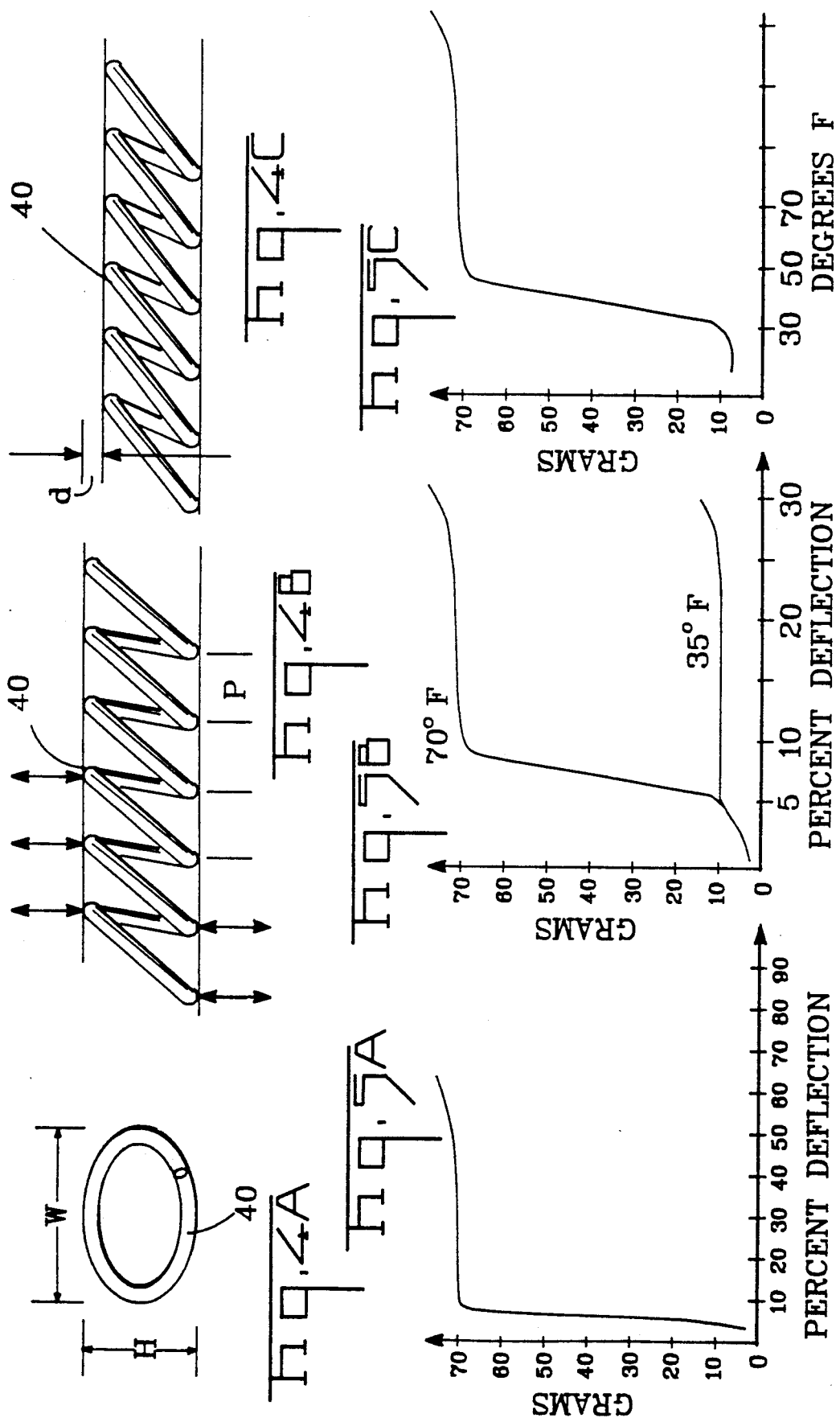

ELECTRICAL CONNECTOR USING SHAPE MEMORY ALLOY COIL SPRINGS

This invention relates to a high density electrical connector for connecting contacts on close centers through the use of a spring system made of shape memory alloy to be operable upon temperature variation.

BACKGROUND OF THE INVENTION

U.S. Pat. No. 4,621,882 granted Nov. 11, 1986 teaches a type of thermally responsive electrical connector which utilizes a shape memory alloy to effect contact closure. The particular shape memory alloy in this patent operates to close the connector or, in an alternatively suggested embodiment, open the connector responsive to heating and refers to earlier U.S. Pat. Nos. 3,606,592 and 4,018,547 which describe the shape memory phenomenon and further refers to a shape memory alloy Nitinol which has a transition temperature range (TTR) which can be varied depending upon the alloy. TTR values between −60 degrees Fahrenheit and +300 degrees Fahrenheit are known.

U.S. Pat. No. 4,911,643 issued Mar. 27, 1990 is drawn to a high density and high signal integrity connector based upon shape memory alloy positioned within a tube and operable to drive contact pads on a flexible dielectric film to open and close against a printed circuit board and the conductive pads thereon. This patent mentions a high density interconnect as being related to 100 to 250 conductor lines per inch, such density being achieved by the forming of conductive paths and conductive pads on flexible film. The patent further teaches the use of a spring member which is contiguous to the film carrying paths and pads and coextensive therewith and is given an elongated hollow split tube geometry. A heat recoverable member of shape memory alloy is positioned concentrically within the spring member and is operable in its low strength state to be overcome by the spring member but in its high strength state to in essence overcome the spring member and open the connector in effect disconnecting the various pads. This patent mentions a reference to shape memory alloys as "Shape Memory Alloys" by L. Donald Schetky, *Scientific America,* Volume 281, November 1979, pages 74–82. In that publication and in other cited publications, the point is made that the transition temperatures for shape memory alloys allowing them to go from a high strength state to a low strength state and reverse can be quite varied by varying the alloy and by varying the "training" of the material.

U.S. patent application Ser. No. 07/387,269 filed July 28, 1989, now abandoned, relates to high density electrical connectors utilizing canted coil springs as the force driving mechanism to effect interconnection between circuit paths and pads such as are found on printed circuit boards. It has been found that the canted coil spring, as will be explained hereinafter, provides normal forces quite sufficient to effect stable electrical interconnections between contact pads linearly, along the length of the spring, while at the same time providing discretely resilient points of force generation. Because of this, canted coil springs are uniquely suited to high density interconnections wherein radial tolerance variations along the linear length of contact arrays otherwise limit individual action by conventional springs which are tied closely together or common along such linear length.

With respect to high density connectors of the type being discussed, one of the problems is that if contact springs have enough force to generate sufficient normal contact force, the forces of insertion and withdrawal with respect to high density connectors where there are dozens, if not hundreds, of contact pads make circuit board insertion and extraction difficult with possible damage to the contacts or components carried on such boards. For this reason, a number of connectors have been developed which are termed LIF connectors for low insertion force uses and ZIF for zero insertion force uses. The earlier mentioned patents dealing with shape memory alloy elements purport to provide either of these types of connectors. The last mentioned applications are not intended to provide either of these types of interconnections.

Accordingly, it is an object of the present invention to provide a low force electrical connector for high density electrical interconnection applications which can be operated between two conditions, a low force engagement and a high force engagement. It is a further object to provide a low cost means effective to cause interconnections of contact pads on close centers by individual spring members in the form of a canted coil structure itself made of a shape memory alloy responsive to temperature variations to effect forces for insertion, withdrawal, and mating contact. It is yet a further object to provide a novel interconnection medium capable of providing in one piece large numbers of individual force vectors along the linear length thereof which can be varied in response to selected temperature changes.

SUMMARY OF THE INVENTION

The present invention relates to an electrical connector which provides high density interconnections through contact paths of printed circuit pads such as are found on printed circuit boards utilized to interconnect components to provide circuit functions. The invention connector utilizes a thin dielectric film having circuit pads on portions thereof interconnected by circuit paths with such film being held in a connector so as to engage the pads on the daughter and mother boards and provide an interconnection therebetween. The use of a film allows photolithographic processes to be utilized for the connector as well as for the mother and daughter boards thus allowing the ready production of contact pads on very close centers. In the invention connector, a housing is provided adapted to receive a daughter board and hold and position and align such board relative to a mother board on which the connector is mounted. The connector contains the film as mentioned and further includes canted coil springs which individually bias the circuit pads of the film against the pads of the daughter board and against the pads of the mother board. In accordance with the invention concept, at least one of the canted coil springs is made of a shape memory alloy operable at one condition of temperature to provide a relatively low force to the interconnection facilitating insertion and withdrawal of the daughter board, an LIF connector. A second condition of the spring generates a relatively high force, individually associated with each turn of the spring coil along the linear length thereof to effect a stable low resistance interface. The canted coil spring utilized to interconnect with the mother board may be a standard coil spring in that the interconnection theremade is seldom unmade. The invention does contemplate having both the coil springs made of shape memory alloy and operable to temperature variation. The invention does contemplate multiple rows of coil springs and contact paths and pads to further increase the density of interconnections. In the illustrative embodiment of the invention, the connector is formed of a rigid metallic tube structure and has connected thereto passages adapted to carry liquid or gaseous refrigerants which may be varied in temperature to effect the different conditions of the shape memory alloys being employed.

The invention contemplates other means of providing temperature variations as well.

IN THE DRAWINGS

FIG. 4A is an end view of a canted coil spring utilized with the connector of the invention;

FIGS. 4B and 4C are side elevational views of the spring shown in FIG. 4A in the different conditions of activation;

FIG. 5A is a schematic view of a force deflection characteristic for the spring shown in FIGS. 4A-4C;

FIG. 5B is an illustrative sketch of a force deflection characteristic for shape memory alloys;

FIG. 5C is an illustrative sketch of a force temperature characteristic for a deflected canted coil spring.

DETAILED DESCRIPTION OF THE INVENTION

Figure 1:
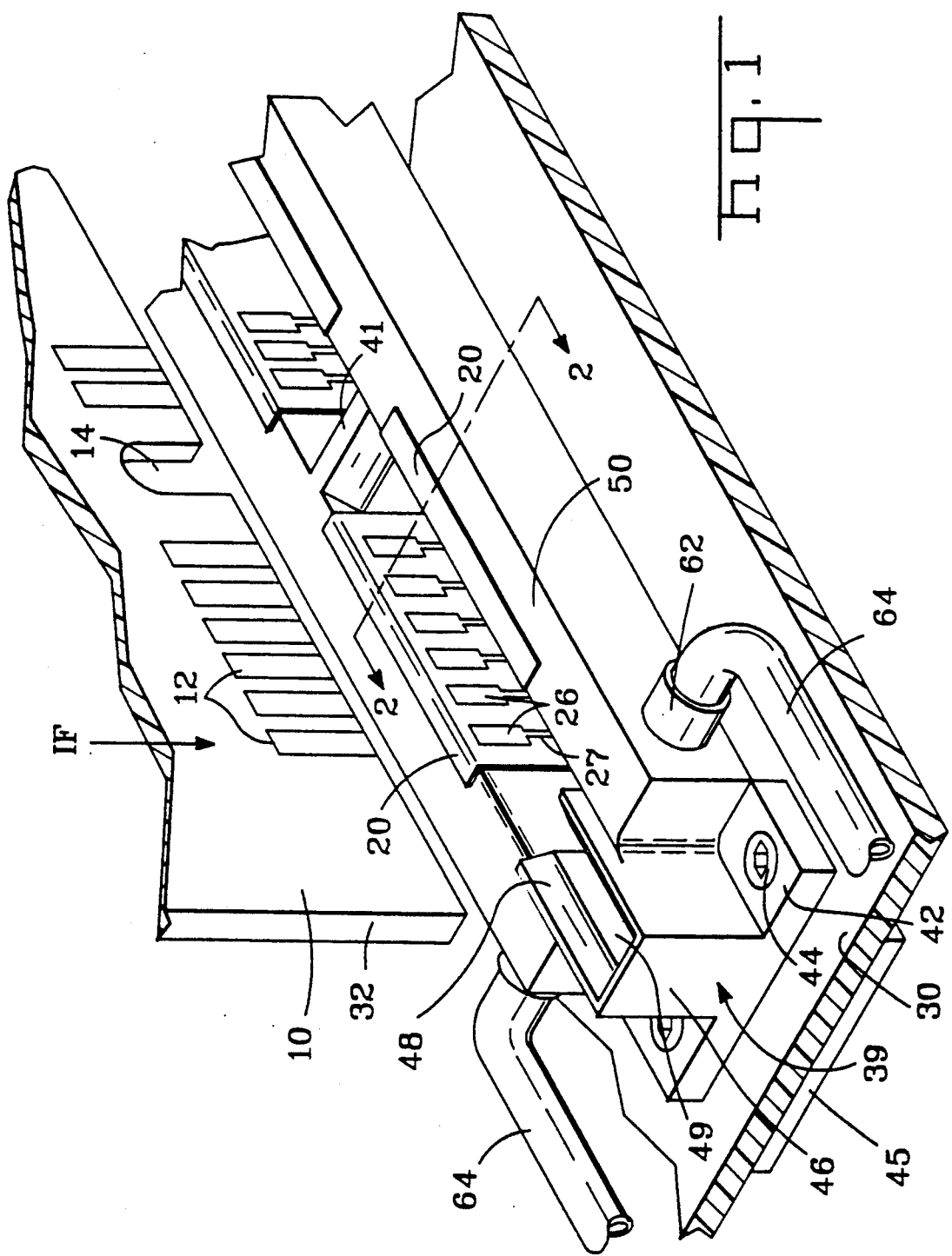
FIG. 1 is a perspective showing the connector of the invention mounted on a mother board and preparatory to receiving a daughter board for interconnection therewith.

Referring now to FIG. 1, an assembly of a daughter board 10, a mother board 30 via a connector 39 is shown with the daughter board 10 preparatory to insertion within connector 39. Connector 39 is mounted to the mother board 30 and in practice, numbers of connectors 39 and numbers of daughter boards would be utilized with a given mother board 30. The daughter boards typically carry components including integrated circuits, discrete elements, capacitors, inductors and resistors and the like to form circuit functions. It is this construction which forms much of the basis of the electronic industry with the ability to insert or remove and change a given daughter board allowing for circuit upgrades, repair and the like. Typically, the board 10 includes a series of conductive pads 12 arrayed along one or both side edges thereof and interconnected by circuit paths or traces not shown to the components carried on the board. The board 10 includes in the embodiment shown in FIG. 1 a slot 14 which mates with a projection 41 of the connector 39 and guides the board into position for insertion within connector 39.

Figure 2:
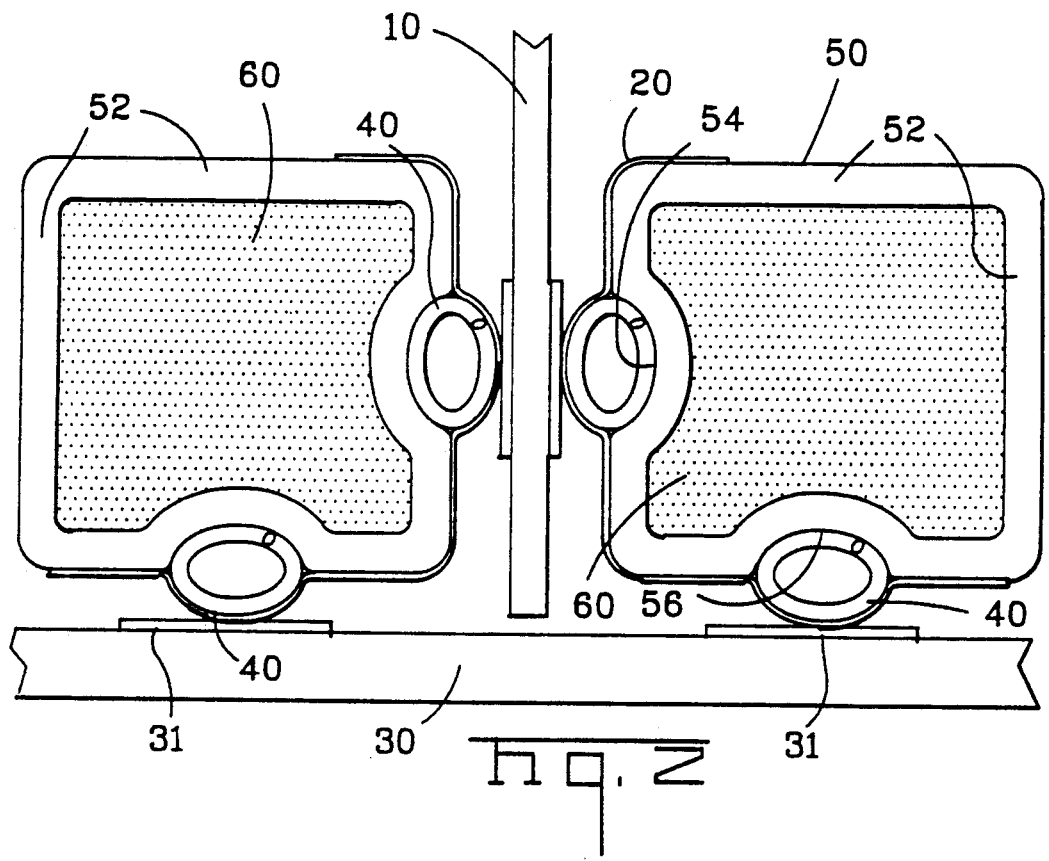
FIG. 2 is a section taken along lines 2—2 of FIG. 1 showing portions of the mother and daughter boards and the connector of the invention.

The connector 39 is fabricated of a suitable material such as high strength zinc alloy to include as shown in FIG. 1 at the near end a pair of flanges 42 through which are passed fasteners 44 which extend through board 30 and join a metal plate element 45 beneath the board to lock the connector thereto. Connector 39 has at each end, the near end being shown, the far end being unshown, a board guide structure 46 beveled at the top as at 48 and slotted as at 49 to receive the edge of card 10 and hold such edge in position, a similar structure at the other end not shown holding the other end edge of card 10. Integral with the guide structure 46 are connector body elements 50 spaced apart and formed of metal to be rigid and nonyielding transverse to the length thereof for purposes to be described. The connector body elements 50 are in fact hollow as indicated in FIG. 2 and include relatively thick wall sections 52 which, on the surfaces which face boards 10 and 30, have external grooves 54 and 56 for purposes to be described.

Figure 3:
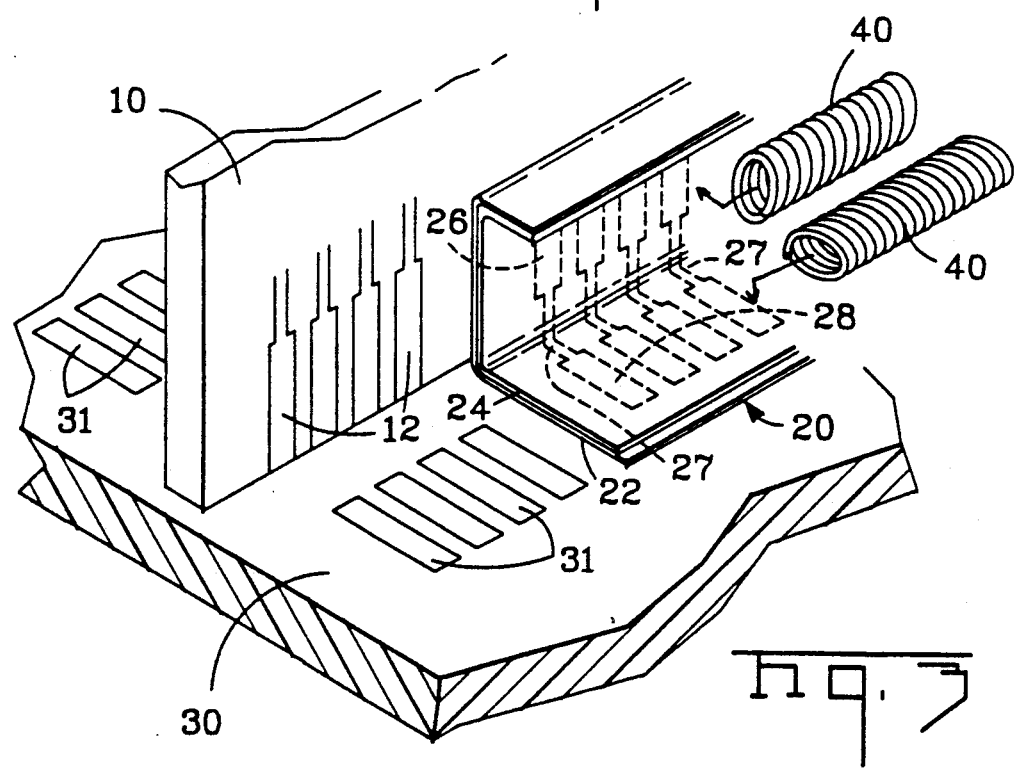
FIG. 3 is an exploded and enlarged view showing schematically the operable elements defining the interconnection of the connector of the invention.

Referring now to FIG. 3, the mother and daughter boards can be seen with their respective conductive contact pads 12 and 31, showing the right-hand side of the connector. Positioned in this view spaced apart from these contact pads is a thin film dielectric element 20 which is comprised of a lamination including a dielectric film 22 formed of materials such as polyester or polyamide materials and may have laminated and bonded thereto a thin foil 24. The foil 24 serves as a grounding and shielding plane. The contacts include on a side opposite to foil 24 contact pads 26 and 28 which extend in a row one for one along the length of the board pads. The contact pads 26 are connected to the contact pads 28 by circuit paths or traces 27 formed as by etching when the contact pads 26 and 28 are formed. This is done when the film is in a flat state so as to facilitate the use of photolithographic techniques which can achieve far greater accuracy and closer center-to-center spacings than is the case with stamped and formed contacts. Thus, the technique of interconnection, including the component 20, is compatible with the similar techniques used to form the contact pads 12 and 31 on the daughter and mother boards. In accordance with the invention, canted coil springs 40 are positioned to lie behind the rows of contact pads 26 and 28 and drive such pads against the contact pads 12 and 31 to effect an interconnection therebetween. The various components, including the springs 40, and element 20 are shown in engagement in FIG. 2.

Referring now to FIGS. 4A-4C, the characteristics of a canted coil spring are depicted. In FIG. 4A an end view of the spring shows it to be oval with a given height and width, H and W, and FIG. 4B shows the spring to have a given pitch P, all of which are quite variable, depending upon a particular application. For example, canted coil springs can be purchased from the Bal Seal Engineering Company, Inc., Santa Ana, Calif. 92707, made of wire of many sizes and in many configurations. Small coil springs of wire range on the order from 0.005 inches up to large coil springs of wire on the order of 0.062 inches in diameter. Dimensions H range from 0.043 to 0.450 inches and widths W from 0.050 to 0.557 inches. FIG. 4C shows a deflection d which represents the working deflection of the spring which typically does not exceed 40 percent of H before the spring stacks up on itself and is bound. FIG. 5A shows generalized spring deflection characteristics for a canted coil spring in terms of force and deflection and as can be discerned, at or about just above 30 percent deflection the force necessary to effect further deflection increases drastically. Also to be noted in FIG. 5A is the characteristic which is desirable in canted coil springs, particularly with respect to connectors which shows the spring to have a relatively linear force deflection characteristics from just below or at 10 percent deflection up to approximately 30 percent deflection. With respect to the foregoing, an important aspect of the use of canted coil springs with respect to connectors relates to the fact that as the springs are deflected, each of the coils generates a normal force as indicated by the small arrows in FIG. 4B which, within certain limits, is relatively independent of the adjacent coils. What this means is that small tolerance differences in the stack up of component elements such as the printed circuit board thicknesses, the film thicknesses, the pad thicknesses in particular can be accommodated by this type of spring. And as can be discerned, tolerances can be accommodated transversely, along the length of the spring. Springs of this type can be acquired with various pitches, note P in FIG. 4B, to assure an adequate distribution of forces along the length of the spring. Reference may be had to the Bal Seal Engineering Company, above mentioned, as a source of springs and data relating to such springs.

Figure 6:
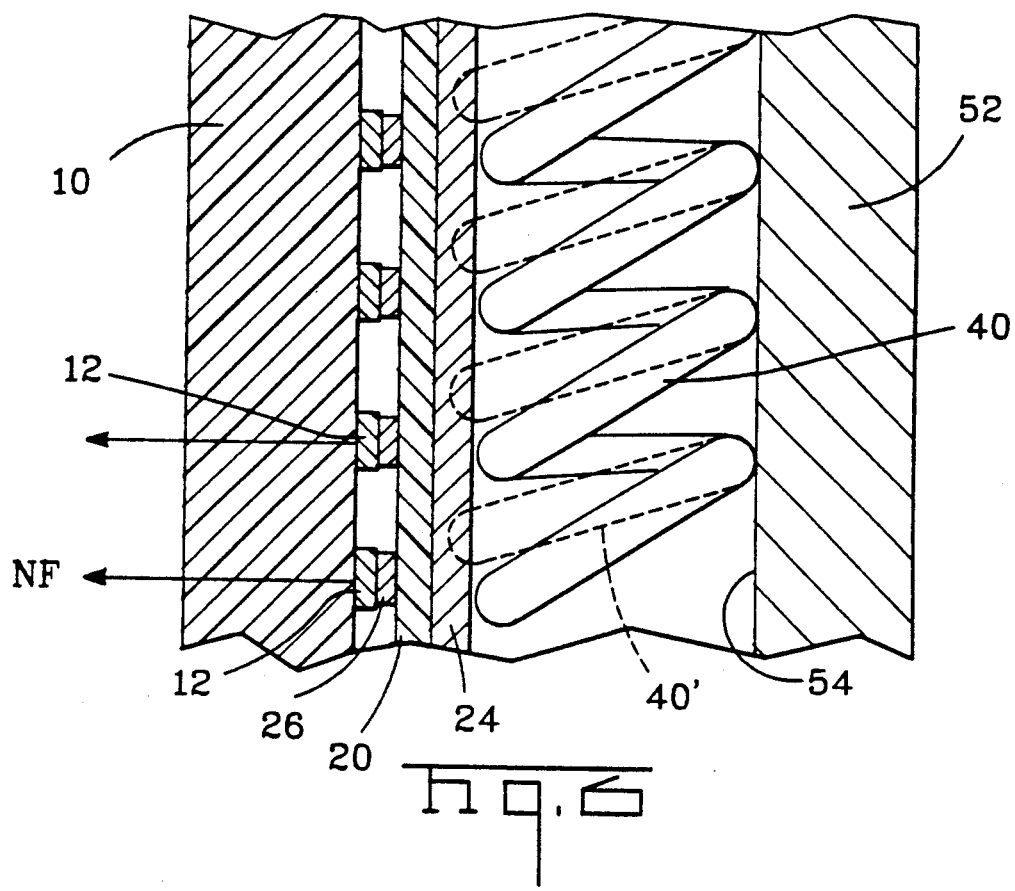
FIG. 6 is an enlarged sectional view including phantom representations of spring action of the connector of the invention as shown in FIGS. 1 and 2.

Referring back to FIG. 3, the invention contemplates the use of a spring 40 having a pitch P and appropriate diameters and characteristics to drive the film 22 and the contacts 26 and 28 toward the respective contact pads 12 and 31. This engagement is shown in FIGS. 2 and 6 with the term NF representing normal force. With respect to the interface between the contact pads 12, 31 and 26 and 28, the necessary forces, normal forces NF, required to effect a stable low resistance electrical interface are dependent upon the types of materials being interfaced. With respect to certain precious metal alloys, including gold alloys, forces on the order of 50 grams or more are employed. With respect to alloys of tin, such as tin lead, material are used for electrical connectors forces on the order of 180 grams or more are employed. As can be appreciated, these normal forces referred to are per contact. Contacts on 0.025 inch centers would thus yield 40 contacts per inch or well over 4 lbs. per linear inch of connector. Multiple rows of contacts per linear inch, many inches long, which is quite common, and 100 grams per contact, which is a commonly used normal force, can mean that connectors, various boards which are interconnected must stand forces on occasion in excess of 100 lbs. The connector 39 must be of a structure to handle these forces and the springs to similarly selected.

As is indicated in FIG. 1, the board 10 and its contact paths is inserted into the connector 39 to effect an interconnection and is withdrawn therefrom to effect a disconnection. Utilizing the canted coil spring as shown in FIGS. 4A-4C would result in substantial normal forces of engagement, dependent upon the degree of deflection of the spring 40 and the numbers of contacts. As indicated, this can be quite high with the resultant frictional wearing of the contact surfaces. In accordance with an aspect of the invention, the coil springs 40 are made of shape memory alloy material. As heretofore mentioned, such alloys can be selected from materials to provide dramatic changes in those characteristics such as Youngs Modulus or Shear Modulus and elongation over a range of transition temperatures. Alloys being commercially used include CuZnAl, CuAl and NiTi. The June 1984 issue of *Mechanical Engineering* includes an article entitled "Shaped Memory Metals" which details appropriate characteristics and refers to a number of sources for such metals. A further source for shape memory metals includes Memry Corporation of Norwalk, Conn. As related in this article and in the foregoing referred to patents and references, alloys may be chosen which exhibit a transformation characteristics at different temperatures. Below a given transformation or phasing temperature, an alloy may exhibit a weak or Martensitic condition so as to facilitate a relatively low force per unit of deflection characteristic and above such temperature the alloy may revert to a parent beta phase or the Austenitic state exhibiting an increase in modulus. Quite the reverse characteristic may be obtained with still further alloys wherein at the higher range of temperature, above the transformation temperature, the alloy is relatively weak and below the temperature it is relatively strong.

In accordance with the invention in an illustrative embodiment, it is contemplated to use a spring 40 of shape memory alloy having a transformation temperature to a weak state at or around 40 degrees Fahrenheit. Springs 40 fabricated with such an alloy material and held below 40 degrees Fahrenheit will therefore have the weak characteristic and above such transition temperature revert to the high force characteristic.

Figure 7:
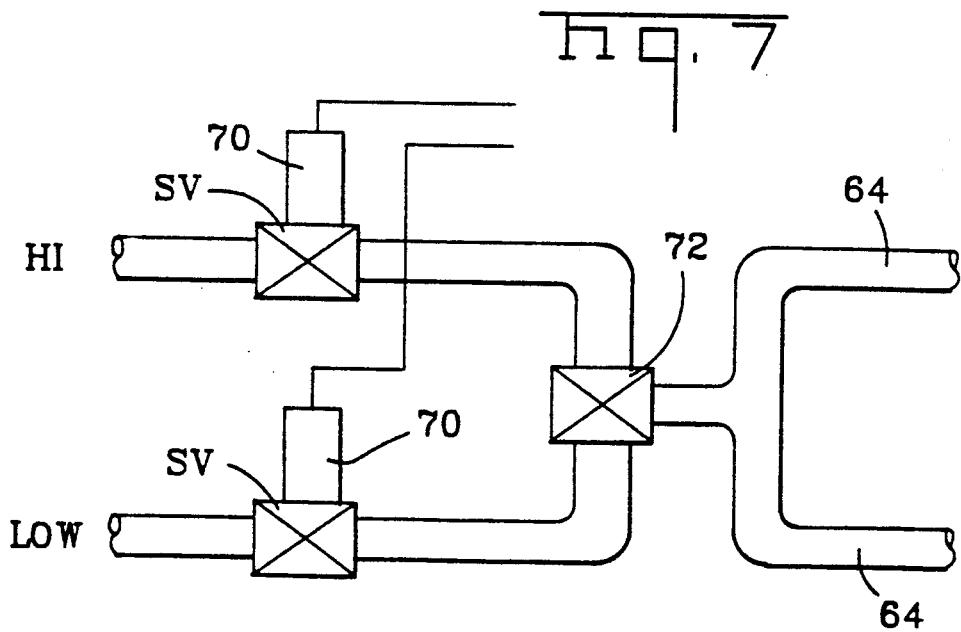
FIG. 7 is a schematic view of the manifolding of a refrigerant utilized in conjunction of one embodiment of the invention.

FIG. 5B shows a characteristic for a given alloy wherein at or about 35 degrees Fahrenheit the normal force exhibited by a coil of the spring 40 as shown in FIG. 4C is on the order of 10 grams. At 70 degrees Fahrenheit, the same coil will exhibit a normal force upon compression of on the order of 70 grams. Moreover, the spring 40 may be "trained" to have a geometric disposition as shown in FIG. 4C when in the weak condition and a disposition as shown in FIG. 4B when in the strong condition. This means that with a temperature swing as for example between 35 and 70 degrees Fahrenheit, the spring 40 may be made to not only go from a weak gram load exhibiting condition to a high one, but also to displace laterally of its longitudinal length. Referring now to FIG. 2 and particularly to FIG. 6, the spring 40 is shown disposed within the connector body 52 resting within the grooves 54 and 56 proximate the pads 26 and 28 and the pads 12 on the daughter board and 31 on the mother board. FIG. 6 shows the spring 40 solidly representing the weak state and in phantom as at 40' representing the strong condition. As can be discerned, the individual coils push against the foil 24 proximate to the contact interfaces between pads 12 and 26. The normal forces resulting therefrom, NF, create and maintain a low resistance stable interface. In accordance with a further aspect of the invention, the temperature of the springs 40 is maintained by conductive heat transfer through the metallic walls of bodies 52 to the springs themselves which are in contact with such walls, the film 20 insulating electrically. Within the bodies 52 is, in an illustrative embodiment, a heating/cooling medium 60 which can be made to vary in temperature from on the order of 35 degrees Fahrenheit or less to on the order of 75 degrees Fahrenheit or greater. The medium is, in accordance with the invention, introduced into the interiors of connector bodies 52 through a fitting as at 62 in FIG. 1 and a pipe as at 64 as shown in FIG. 1. Fittings and pipes at the opposite end of the connector bodies, not shown, would remove such medium. FIG. 7 shows a series of pipes, including a source of high temperature medium and a source of low temperature medium, each valved by solenoid valves SV under controls 70 to be mixed at a valve 72 and transferred to the connector bodies via pipes 64. The returns for such medium are not shown.

In this way, a connector 50 may be cooled (or heated as the case might be) to allow the insertion or withdrawal of board 10 with minimum normal forces, an LIF characteristic, or a ZIF connector using the retraction of the spring in its weak condition. Thereafter, upon reinsertion of a board 10 the medium may be introduced into the connector body to heat (or cool) the springs up and cause the strong, expanded condition to occur, thus generating adequate normal forces for each of the multiple contacts of the system. The average length of time generally required is a few seconds or minutes at the most. The invention contemplates the use of systems which employ gases; e.g. Freon, air, $CO_2$, liquid nitrogen, and fluid; e.g. ethylenegylcol, water, and so forth.

The invention also contemplates that heating and cooling can be achieved by other means. For example, heating can be achieved by thermal heating strips and cooling can be achieved by electronic Peltier solid state elements which are now commercially available.

The invention contemplates a use of shape memory alloy springs in conjunction with printed circuit board and film contacts and a source of heat and/or cooling with the springs being made of a shape memory alloy material. The invention also contemplates that the springs 40, utilized to establish contact forces with the mother board, may be of a standard ca2-13nted coil spring steel in that such contacts are rarely made and broken and would, in any event, be brought into engagement by the clamping of the connector 50 through the holding portions thereof into engagement with the mother board.

As mentioned, the invention contemplates using multiple grooves 54 and 56 and springs 40 on the faces of 50 to obtain higher density interiors with an appropriate multiplication of rows of contact pads 26 and 28.

Having now described the invention in terms intended to enable a preferred practice, the invention is defined by the appended claims.

We claim:

1. A high density electrical connector of a type wherein contact pads on close center spacings extending on first printed circuit boards are interconnected to contact pads on a second printed circuit board to form circuit functions, the said connector comprising a means to guide and position the first circuit board relative to the second circuit board and to hold said boards relatively together with the said circuit pads in alignment, a connector body including a flexible film containing circuit pads on rows and centers compatible with the circuit pads of the first and second boards with means holding said films proximate to said pads, said means including grooves in the said connector containing canted coil springs of a cross-sectional dimension and pitch to effect a displacement of the pads of said film into engagement with the pads of said boards, the said canted coil spring being formed of a shape memory alloy material operable over a temperature variation to be rendered into a weak condition to facilitate insertion and withdrawal of the said first board relative to the said second board in said connector and in a second condition to provide normal forces of engagement between the contact pads of said first and second board and said film to provide a stable low resistance interface therebetween, said connector including a hollow body which is sealed at each end and supplied at each end with means to provide a fluid to selectively heat or cool said housing and said springs to alter the condition of said springs.

2. The connector of claim 1 wherein the said film includes a thin foil of metal extending between the said springs and the said film and operable to provide grounding and shielding.

3. The connector of claim 1 wherein the said connector body is given a cross-sectional configuration to provide rigidity transverse to the length thereof.

4. The connector of claim 1 wherein the said shape memory alloy material is selected to have a weak characteristic condition when cooled below 40 degrees Fahrenheit and a strong characteristic condition when heated to on the order of 70 degrees Fahrenheit.

5. The connector of claim 1 wherein the said shape memory alloy material is chosen to facilitate insertion and withdrawal of the first circuit board while in the cooled condition and to generate sufficient normal forces while in the heated condition.

6. An interconnection system for interconnecting printed circuit boards such as mother boards with printed circuit boards such as daughter boards comprising a connector having first means thereon to receive, position, and guide a daughter board relative to the mother board to align the contact pads on the boards for subsequent interconnection, second means provided on said connector to receive, hold, and position a thin film of dielectric material containing interconnected contact pads located on such film in positions of alignment with the pads on said daughter and mother boards, said second means including at least one connector body element formed of a rigid construction having grooves in the outside surfaces thereof oriented toward the said daughter and mother boards with the said film being affixed to said element to cover over said grooves and position the pads thereof in alignment with the said contact pads, a plurality of canted coil spring elements fitted in said grooves and operable to drive the pads of said film into engagement with the pads of said boards, the said springs being formed of shape memory alloy material responsive to changes in temperature to change their condition from Austenitic to Martensetic conditions and reverse and third means provided in said connector to cool or heat the said springs to effect said conditions to selectively facilitate insertion, withdrawal, and maintenance of adequate contact normal forces between the pads on said film and the pads on said boards.

7. The connector of claim 6 wherein the said third means includes a medium and said connector body elements have sealed passages containing said medium to transfer heat therefrom to said springs through the walls of said bodies.

8. The connector of claim 6 wherein the said connector includes parallel body elements spaced apart adapted to receive a daughter board inserted therebetween to effect an interconnection to both sides of said daughter card through the contact pads thereon.

* * * * *